United States Patent [19]

Aboelfotoh et al.

[11] Patent Number: 5,801,444
[45] Date of Patent: Sep. 1, 1998

[54] MULTILEVEL ELECTRONIC STRUCTURES CONTAINING COPPER LAYER AND COPPER-SEMICONDUCTOR LAYERS

[75] Inventors: Mohamed Osama Aboelfotoh, Poughkeepsie; Lia Krusin-Elbaum, Dobbs Ferry; Yuan-Chen Sun, Katonah, all of N.Y.

[73] Assignee: International Business Machines Corporation, Armonk, N.Y.

[21] Appl. No.: 756,829

[22] Filed: Nov. 20, 1996

Related U.S. Application Data

[63] Continuation of Ser. No. 200,832, Feb. 18, 1994, abandoned, which is a continuation of Ser. No. 818,027, Jan. 6, 1992, abandoned, which is a continuation of Ser. No. 561,045, Aug. 1, 1990, abandoned, which is a continuation-in-part of Ser. No. 416,331, Sep. 29, 1989, abandoned.

[51] Int. Cl.$^6$ ...................................... H01L 23/48
[52] U.S. Cl. ...................... 257/762; 257/742; 257/743; 257/744; 257/745
[58] Field of Search ...................... 148/679, DIG. 49, 148/DIG. 58, DIG. 147; 437/195, 196, 180; 257/751, 762, 758, 750, 753, 767, 798, 720, 734, 736, 743, 744, 745; 420/469, 490

[56] References Cited

FOREIGN PATENT DOCUMENTS

| | | |
|---|---|---|
| 0179369 | 4/1986 | European Pat. Off. . |
| 0259616 | 3/1988 | European Pat. Off. . |
| 0335383 | 10/1989 | European Pat. Off. . |
| 2094908 | 10/1982 | United Kingdom . |

OTHER PUBLICATIONS

Thompson et al., "Low temperature gettering of Cu,Ag and An across a wafer of Si by Al", Appl. Phys. Lett. 41(5), 1 Sep. 1982 pp. 440–442.

Cros et al, "Formation, oxidation, electronic and electrical properties of copper silicides", J. Appl. Phys. 67(7), 1 Apr. 1990, pp. 3328–3336.

Hu et al., "Diffusion barriers for Cu", IBM Tech. Disc. Bull. vol. 29, No. 3, Aug. 1986, pp. 1395–1396.

*Primary Examiner*—Carl W. Whitehead
*Attorney, Agent, or Firm*—Daniel P. Morris

[57] ABSTRACT

A low temperature annealed Cu silicide or germanide layer on the surface of a single crystalline semiconductor substrate of Si or Ge is used in interconnection metallization for integrated circuits. The Cu silicide or germanide layer is preferably formed by heating Cu deposited on a Si or Ge substrate up to about 200° C. for about 30 minutes. The layer demonstrates superior (near ideal) current/voltage characteristics and can be used as a high temperature (600–800° C.) stable Ohmic/Schottky contact to Si or as a Cu diffusion barrier. Additional embodiments involve a Cu layer on a Ge layer on Si substrate, a Cu layer on a $Si_x Ge_{1-x}$ layer on a substrate, and the use of an intermediate layer of a refractory metal such as W.

14 Claims, 13 Drawing Sheets

MULTILEVEL ELECTRONIC STRUCTURES CONTAINING COPPER LAYER AND COPPER-SEMICONDUCTOR LAYERS

CROSS-REFERENCE TO RELATED APPLICATIONS

This application is a continuation of Ser. No. 08/200,832 filed Feb. 18, 1994 now abandoned which is a continuation of Ser. No. 07/818,027 filed Jan. 6, 1992 now abandoned which is a continuation of Ser. No. 07/561,045 filed Aug. 1, 1990 now abandoned which is a continuation in part of Pat. No. 416,311 filed Sep. 29, 1989 now abandoned.

BACKGROUND OF THE INVENTION

1. Field of the Invention

The invention relates to the production and use of copper-semiconductor compounds and more particularly to the use of copper in VLSI technology as interconnection metallization in silicon (Si), germanium (Ge), and $Si_x Ge_{1-x}$ electronic devices.

2. Prior Art and Problem Solved

The metal copper (Cu) has very good electrical conductivity and as a result there is currently a wide interest in and effort toward developing Cu as interconnection metallization in future silicon (Si), germanium (Ge), and $Si_x Ge_{1-x}$ electronic devices. However, it is known that Cu diffuses into Si, producing deep energy levels in the Si energy gap which can act as efficient recombination centers thus effecting minority-carrier lifetime. This, in turn, results in severe degradation of the electrical characteristics of such devices as metal-Si Schottky-barrier and p-n junctions. Also, it is known that Cu in Ge introduces several acceptor energy levels in the energy band gap of Ge. Such energy levels similarly can act as recombination centers or as traps giving rise to excess current which causes severe degradation of the electrical characteristics of such devices as p-n and metal-Ge Schottky-barrier junctions.

Following from the experience and belief in the art that Cu always diffuses in Si and other single crystalline semiconductor materials, a problem has existed in the art to create Cu-semiconductor interfaces in VLSI devices while avoiding degradation of current-voltage characteristics in such devices. The process and system of the present invention offer a solution to this problem as well as offering other advantageous applications.

SUMMARY OF THE INVENTION

In accordance with the present invention, it has been found that Cu may be combined with a single crystalline semiconductor to form Cu-semiconductor compounds at room temperature, and in the preferred VLSI embodiment junctions formed by the deposition of Cu on a single crystalline semiconductor substrate, e.g., Si, at room temperature, are treated, such as by maintaining them at room temperature for extended periods or accelerating the process by annealing, e.g., at 200° C. for 30 min., to convert the as-deposited Cu/Si interface into a well-reacted silicide ($Cu_3Si$)/Si interface. In the as-deposited state, these junctions display highly nonideal current-voltage characteristics, that is, they exhibit large excess current under forward and reverse bias conditions; but, it has been found that, remarkably, simple treatment, e.g., by low-temperature annealing, results in junctions which exhibit ideal current-voltage characteristics. Characterization of these junctions using techniques such as deep-level transient spectroscopy reveals that such low-temperature annealing causes the disappearance of the deep energy levels which are believed to be acting as efficient recombination centers giving rise to large excess current under forward and reverse bias conditions. Moreover, the ideal current-voltage characteristics displayed by the comparatively low-temperature, 200° C.—annealed junctions are found to remain unaffected by further annealing of the junctions at higher temperatures such as 600° C. for 30 min. These findings are very significant in that they show that copper, through the vehicle of the resulting silicide interface, can be used as an "electrically" stable interconnection metallization in future VLSI devices, e.g., as a high temperature (600°-800° C.) stability Ohmic/Schottky contact to Si or as a Cu diffusion barrier.

Similarly, as in the case of Cu on Si, it has been found that annealing junctions formed by the deposition of Cu on Ge, at temperatures as low as 150° C. to 200° C., to form $Cu_x Ge_{1-x}$ compounds results in junctions which exhibit ideal current-voltage characteristics. Also, the ideal current-voltage characteristics displayed by junctions annealed at such low temperatures are found to remain unaffected by further annealing the junctions Up to 600° C. This demonstrates the feasibility of using $Cu_x Ge_{1-x}$ as electrically stable contact and interconnection metallization in future Ge and $Ge_x Si_{1-x}$ devices.

Additional embodiments can include a Cu layer oil a Ge layer on a Si substrate, a Cu layer on a $Si_x Ge_{1-x}$ layer on a Si substrate, and the use of an intermediate layer of a refactory metal such as tungsten (W). The various embodiments can be applied in advantageous ways in the production of FET, CMOS, NMOS and like devices as described in detail below.

Consequently, it has been found that Cu can be readily combined with semiconductor materials and that a Cu interconnection metallization for integrated circuits can be formed by depositing a Cu film on a single crystalline semiconductor substrate held at room temperature, and treating the Cu coated substrate to form a Cu-semiconductor compound interface junction which has ideal current-voltage characteristics.

DETAILED DESCRIPTION OF THE PREFERRED EMBODIMENTS

The present invention involves a system and method for forming Cu-semiconductor compounds and the advantageous application thereof to creating interconnection metallization for integrated circuits wherein a Cu film is deposited on a single crystalline semiconductor layer or substrate, e.g., of Si or Ge, held at room temperature, and the Cu-coated substrate is treated to form a Cu-semiconductor compound interface junction. The treatment may consist of merely maintaining the Cu-coated substrate at room temperature for an extended period, e.g., at least about two hours, but typically several hours and possibly for weeks, depending on the thickness of the Cu film. However, in keeping with present processes for manufacturing VLSI devices, the formation of the interface junction may be accelerated by heating the Cu-coated substrate to a temperature of at least about 150° C. for at least about 20 minutes, and preferably at about 200° C. for 30 min., to form a Cu-semiconductor compound interface junction.

Figure 1:
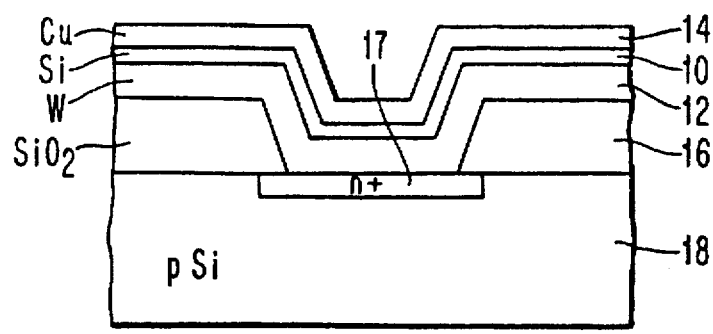
FIG. 1 is a diagrammatic cross-sectional view of a VLSI device with an upper Cu layer deposited on a Si layer in accordance with one embodiment of the present invention wherein the layer of Si is first deposited on top of a W layer which is currently used to contact p-n junctions in bipolar technology.
Figure 2:
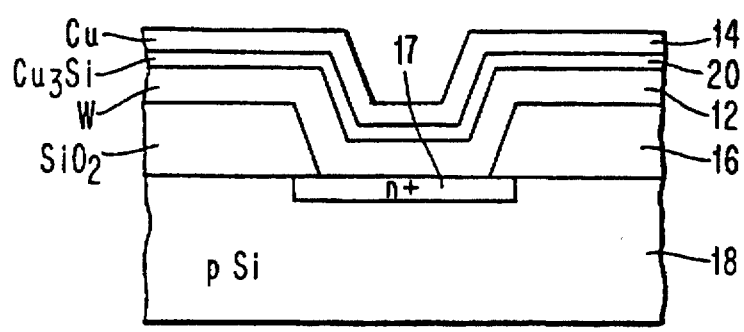
FIG. 2 is a view as in FIG. 1 of the device after heating to form a copper silicide ($Cu_3Si$) layer in keeping with the invention.

More particularly, an example of one embodiment of the present invention will be described with reference to FIG. 1, wherein Cu is deposited on Si to form a stable interconnection metallization in VLSI devices. As shown in FIG. 1, a layer 10 of Si, typically of ~300–500 Å thickness, is first deposited on top of a layer 12 of refractory metal, e.g., tungsten (W), which is currently used to contact p-n junctions in bipolar technology. This is followed by the deposition of a layer 14 of Cu, typically of ~3000–5000 Å thickness, on top of the Si layer 10. The structure, which in the example also includes a Si oxide ($SiO_2$) layer 16 and n$^+$ diffused region 17 formed in a p-type Si substrate 18, is then heated to 200° C. for 30 min. to form a copper silicide ($Ci_3Si$) layer 20 as shown in FIG. 2.

Figure 3:
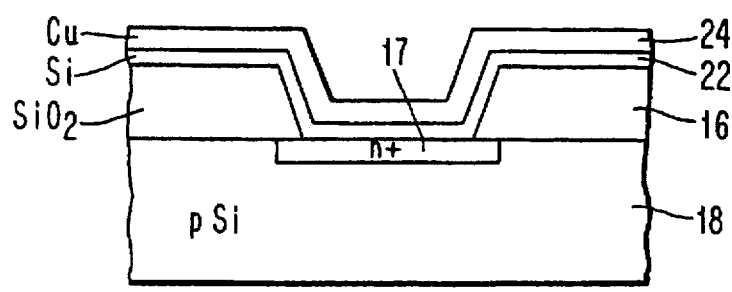
FIG. 3 is a diagrammatic cross-sectional view showing a device in accordance with an alternative embodiment of the invention wherein a layer of Si is first deposited over the entire Si substrate (or a layer of polyimide), and then a Cu layer is deposited on top of the Si layer.
Figure 4:
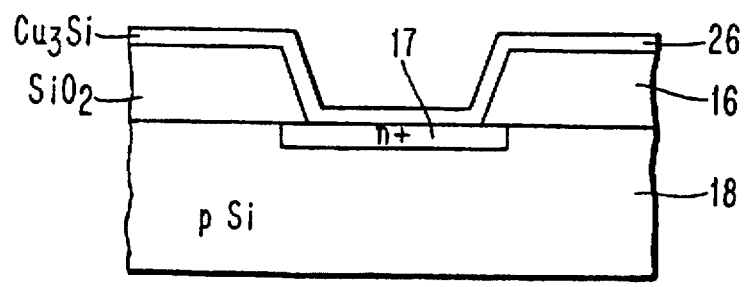
FIG. 4 is a view as in FIG. 3 of the device after heating to form a copper silicide ($Cu_3Si$) layer in keeping with the invention.
Figure 5:
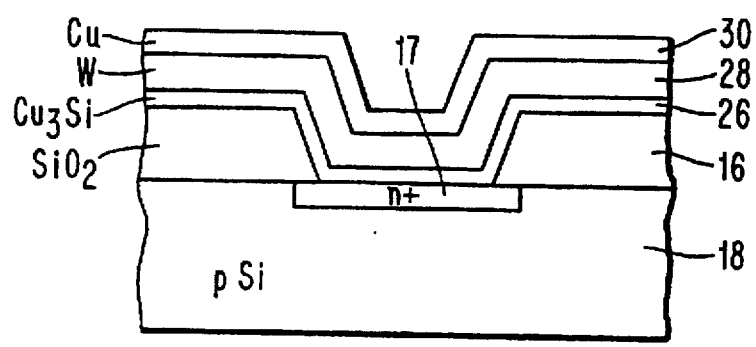
FIG. 5 is a view as in FIG. 4 wherein the formation of copper silicide is followed by the deposition of a W layer and then a second layer of Cu on top of the W layer.

An alternative embodiment is illustrated in FIG. 3, wherein a layer 22 of Si (~300–500 Å) is first deposited over the entire Si substrate, i.e., the $SiO_2$ layer 16 and the exposed portions of the Si substrate 18, and then a layer 24 of Cu (~500–1500 Å) is deposited on top of the Si layer as shown in the Figure. The structure is then heated to about 200° C. for 30 min. to form copper silicide ($Cu_3Si$) 26 as shown in FIG. 4. This is followed by the deposition of a layer 28 of W and then a second layer 30 of Cu (~300–500 Å) on top of the W layer as shown in FIG. 5. This structure is found to be electrically stable up to 600° C. for 30 min..

As an alternative to the $SiO_2$ for layer 16, it has been found that if an insulating layer of polyimide is used, excellent adhesion between the silicide formed and the polyimide will be achieved.

Figure 6:
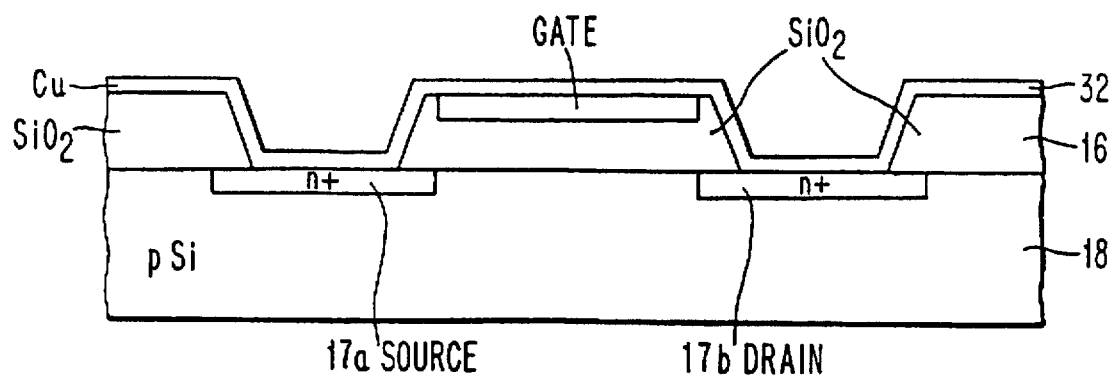
FIG. 6 is a diagrammatic cross-sectional view showing a FET device in accordance with a further embodiment of the invention using copper silicide ($C_3Si$) to contact source and drain regions and wherein a layer of Cu is first deposited over the entire Si substrate.

In FET devices, copper silicide ($Cu_3Si$) can be used to contact the gate, source, and drain regions. An example is shown in FIG. 6 wherein a layer 32 of Cu (~500–1500 Å) is first deposited over the entire Si substrate contacting source 17a and drain 17b regions in the exposed portions of substrate 18 and gate 17c of polysilicon. The structure is then heated to 200° C. for 30 min. to form copper silicide ($Cu_3Si$) 34 and the excess copper silicide is chemically removed, resulting in the structure shown in FIG. 7. Here, a substantial advantage over prior art is that ohmic contacts to source and drain regions can be achieved at very low temperatures, about 150°–200° C., as compared to levels of 600° to 700° C. which are currently used in existing technology.

Figure 41:
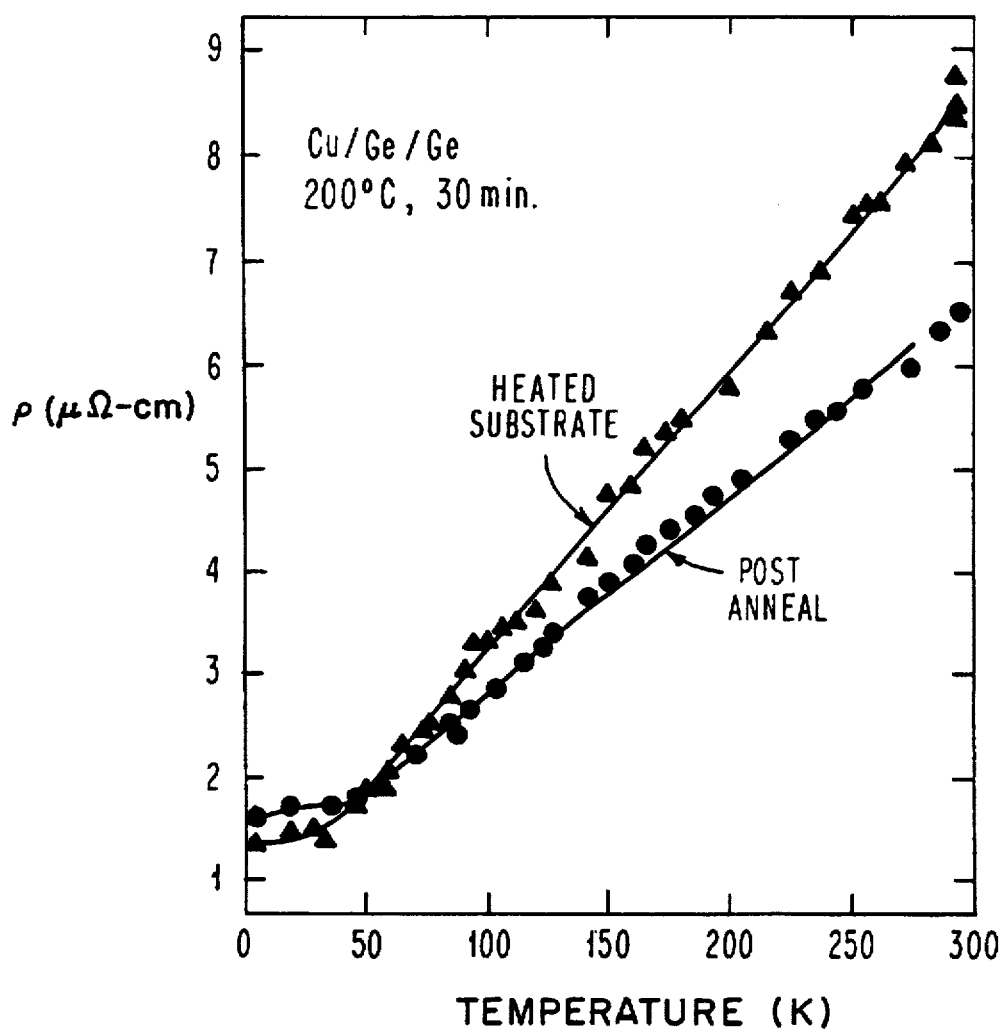
FIG. 41 shows the temperature dependence of the resistivity of $Cu_3Ge$.

A similar configuration may be achieved substituting Ge for Si, and, in fact, it has been found that copper germanide ($Cu_3Ge$) offers the lowest room temperature resistivity in a stable compound so as to be particularly suitable for use in contact and gate material. FIG. 41 shows the results of resistivity vs. temperature measurements made on copper germanide ($Cu_3Ge$). $Cu_3Ge$ is formed by reacting Cu with Ge at room temperature or typically temperatures as low as 200° C. and below. It may be formed both on Ce or Si substrates. For (Cu$_3$Ge) formed on Ge substrates the room-temperature (300 K) resistivity is found to be in the range of 5.5–7 μΩ-cm for a 2000 Å film. At 4.2 K resistivity is 1.7 μΩ-cm. For films formed on Si substrates the resistivity values at 300 K and 4.2 K are, respectively, 14 and 5 μΩ-cm. It is believed that the approximate factor of two increase in resistivity on the Si substrate is primarily due to the incorporation of Si into the (Cu$_3$Ge) during annealing. This increase can be reduced by adjusting the relative thicknesses of the Cu and Ge. By comparison, the resistivity values of polycrystalline TiSi$_2$ and CoSi$_2$, at room temperature, are 15 and 25 μΩ-cm respectively. Here again it is important to note that while TiSi$_2$ and CoSi$_2$ are normally formed at temperatures as high as 600° to 700° C., the low resistivity (Cu$_3$Ge) is readily formed at 200° C.

Returning to the substitution of Ge for Si, for example, the Ge can be first deposited followed by the deposition of the Cu. Their thicknesses are adjusted for the minimal Si incorporation during the formation of the germanide; or, the Cu$_3$Ge can be used as a gate metal directly on SiO$_2$ or polysilicon. In the latter instance, the Cu$_3$Ge has been shown to be thermally stable on SiO$_2$ up to 600°–700° C.

Figure 8:
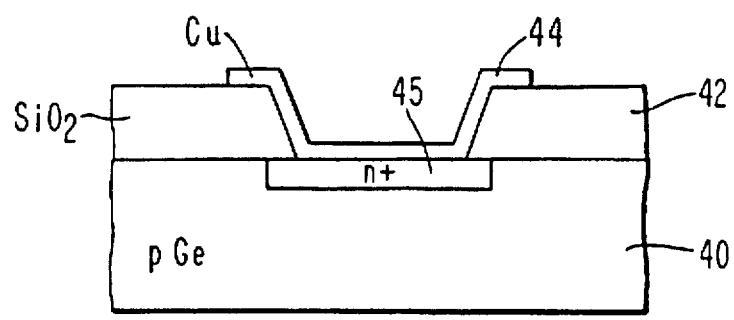
FIG. 8 is a diagrammatic cross-sectional view showing a device in accordance with another embodiment of the invention wherein $Cu_x Ge_{1-x}$ is used as stable contact and interconnection metallization and a layer of Cu is first deposited over the exposed surface a a$^+$ diffused region formed in a p-type Ge substrate and over an oxide layer.
Figure 9:
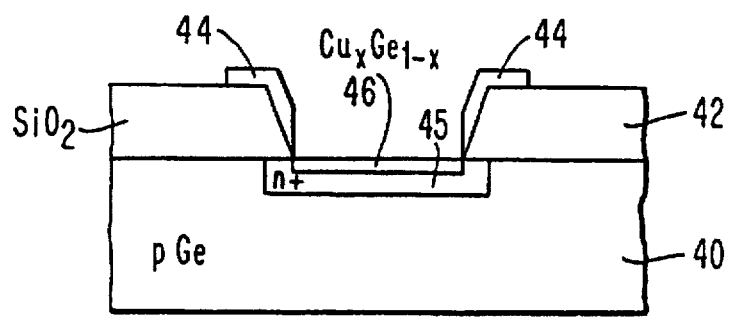
FIG. 9 is a view as in FIG. 8 of the device after heating to form a layer of $Cu_x Ge_{1-x}$ in keeping with the invention.
Figure 10:
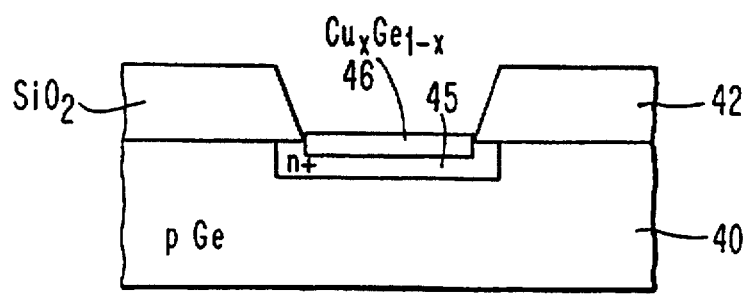
FIG. 10 is a view as in FIG. 9 of the device after the excess unreacted Cu has been removed using an excimer laser to etch only in areas where the laser light impinges on the substrate.

FIGS. 8–12 show examples of how Cu$_x$Ge$_{1-x}$ can be used as stable contact and interconnection metallization in future devices. A layer 44 of Cu, as shown in FIG. 8, is first deposited to a thickness in the range of ~2000 to 3000 Å over the exposed surface of a n$^+$ diffused region 45 formed in a p-type Ge substrate 40 and over an oxide layer 42. The structure is then heated to 200° C. to form a layer 46 of Cu$_x$Ge$_{1-x}$ as shown in FIG. 9. The excess unreacted Cu is then removed using a technique which utilizes excimer laser such as KrF at 248 nm or ArF at 193 nm and selected Freon gases such as CF$_2$Br$_2$ as disclosed by J. H. Brannon in IBM TDB, vol. 28, No. 8, 1986. In such a process, etching takes place only in areas where the laser light is impinging on the substrate 40, allowing the use of a simple light-pattern forming system. This results in the structure shown in FIG. 10.

Figure 11:
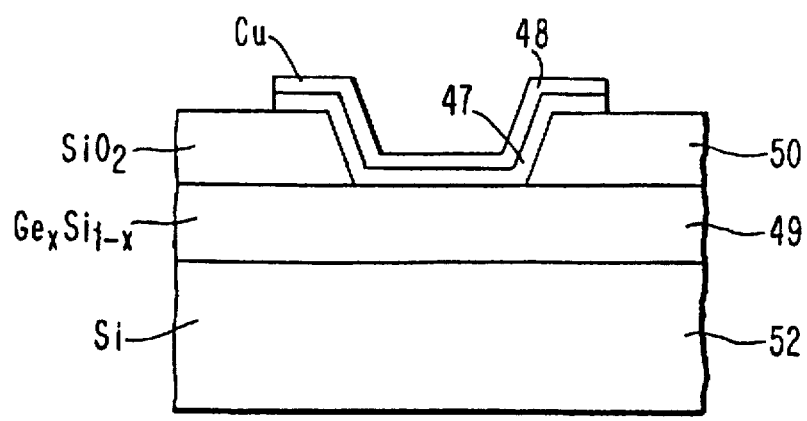
FIG. 11 is a diagrammatic cross-sectional view showing a $Ge_xSi_{1-x}$/Si junction in accordance with a further embodiment of the invention wherein a layer of Si or Ge is first deposited over the exposed surface of the $Ge_xSi_{1-x}$ layer through a window formed in the oxide layer and then followed by the deposition of a Cu layer.
Figure 12:
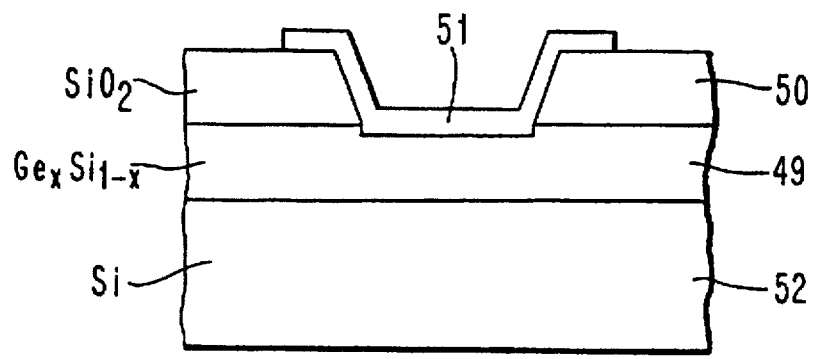
FIG. 12 is a view as in FIG. 11 of the device after heating to form a $Cu_xSi_{1-x}$ or $Cu_x Ge_{1-x}$ contact metallization.

In the fabrication of Ge$_x$Si$_{1-x}$/Si junctions, a layer 47 of Si or Ge, as shown in FIG. 11, is first deposited to a thickness in the range of ~75 to 500 Å over the exposed surface of a Ge$_x$Si$_{1-x}$ layer 49 through a window formed in the oxide layer 50, followed by a Cu layer 48 to a thickness in the range or ~125 to 3000 Å. The structure disposed on substrate 52, e.g., of Si, is then heated to 200° C. to form Cu$_x$Si$_{1-x}$ contact metallization 51 as shown in FIG. 12.

Again, a substantial advantage to be gained with the present invention over the prior art is that electrically stable contact metallization in Ge and Ge$_x$Si$_{1-x}$ devices is formed at low temperatures.

Figure 13:
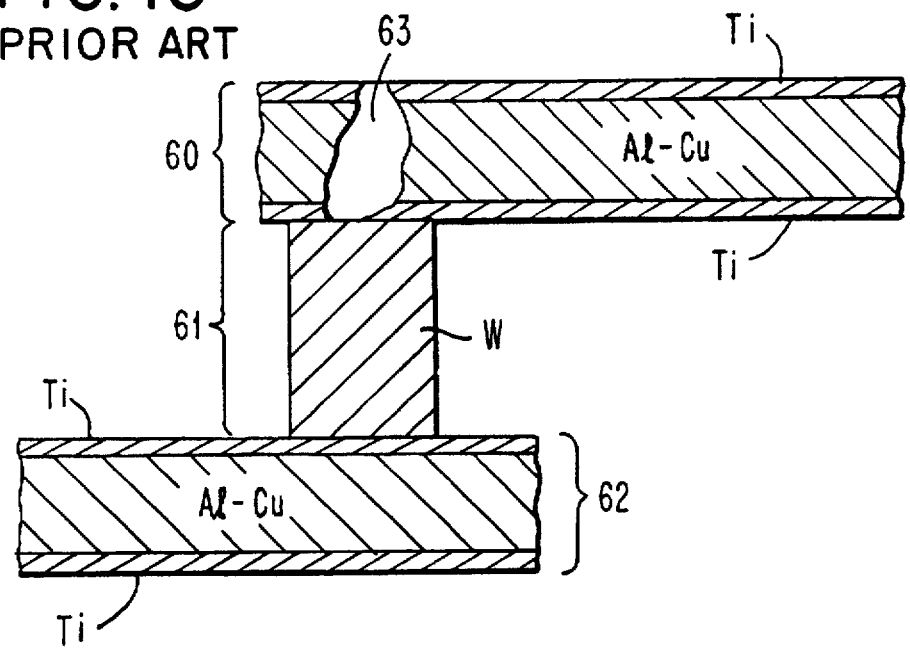
FIG. 13 is a diagrammatic cross-sectional view illustrating a two level interconnecting structure, of a form considered likely to be used for multilevel interconnect metallization, containing a void-open failure in the upper line just above the connecting stud.
Figure 14:
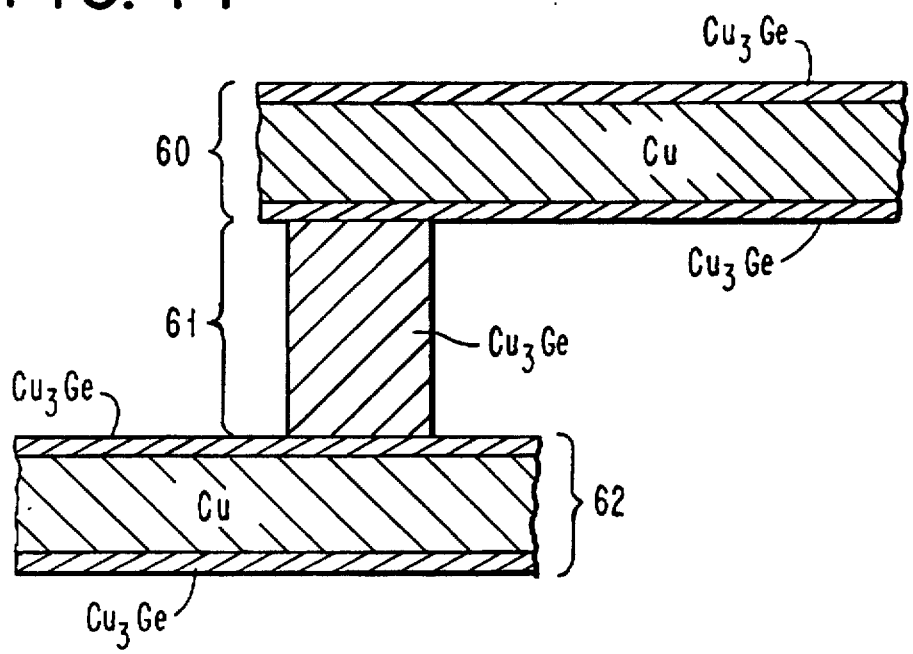
FIG. 14 is a view as in FIG. 13 showing components in keeping with the invention for obviating void-open failures.

A further application of Cu$_3$Ge is as electromigration resistant, low resistivity wiring and vias in multilevel interconnect and via structures. More particularly, FIG. 13 illustrates a two level interconnecting structure comprising a Ti/AlCu/Ti upper level 60, a W stud in via 61, and a Ti/AlCu/Ti lower level 62 of a form considered likely to be widely used in the future for multilevel interconnect metallization. However, void-open failures have been observed in the upper Ti/CuAl/Ti lines just above the W stud, as shown at 63 in FIG. 13, which are caused by electromigration. FIG. 14 shows an improved two-level interconnecting structure with significantly improved resistance to electromigration in accordance with the invention. In this structure, the via 61 is filled with Cu$_3$Ge and the upper and lower levels 60 and 62 are Cu$_3$Ge/Cu/Cu$_3$Ge tri-layers, as seen in FIG. 14. Both the Cu and Ge may be deposited using chemical vapor deposition (CVD). The thicknesses of Cu and Ge may be adjusted so that Cu$_3$Ge is formed following a low-temperature anneal at 200° C. for 30 min. As noted above, it has been found that Cu$_3$Ge exhibits the lowest room temperature resistivity in a compound, and in addition, Cu$_3$Ge adheres very well to polyimide, SiO$_2$ and Si$_3$N$_4$. In filling the vias, CVD Ge may first be deposited, followed by deposition of CVD Cu, or, alternatively, alternate CVD layers of Ge and Cu are deposited. Then, a 30 min. anneal at 200° C. is performed to produce Cu$_3$Ge. This arrangement provides the advantage over the prior art of a very low resistance and contact resistance structure with high resistance to electromigration. In addition, it is very simple to fabricate and avoids possible harmful effects to the Si devices.

Figure 15:
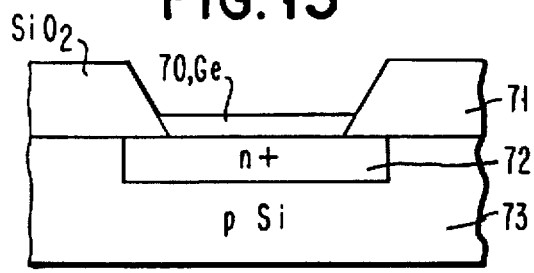
FIGS. 15 through 21 show diagrammatically the steps of a selective etch process used in accordance with the invention to provide extremely high selectivity between Cu and $Cu_3Ge$.
Figure 18:
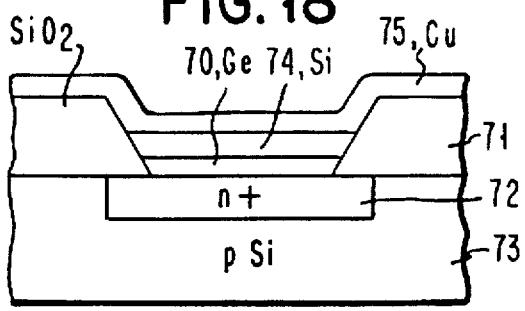
Figure 16:
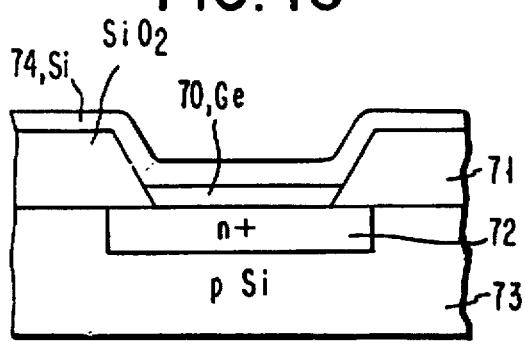
Figure 19:
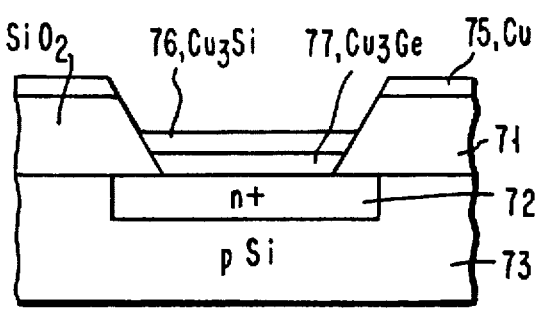
Figure 17:
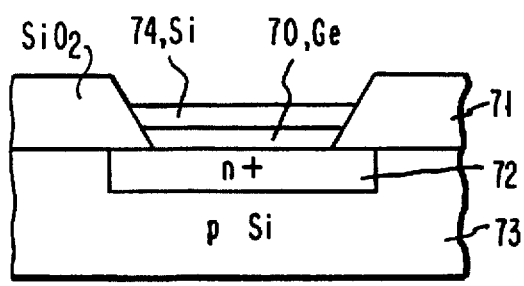
Figure 20:
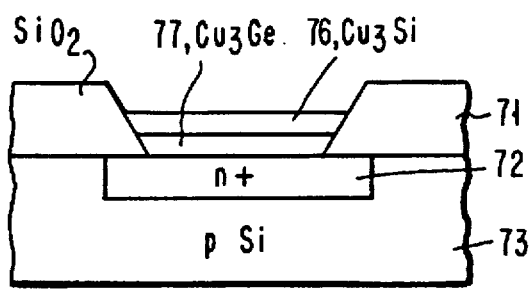
Figure 21:
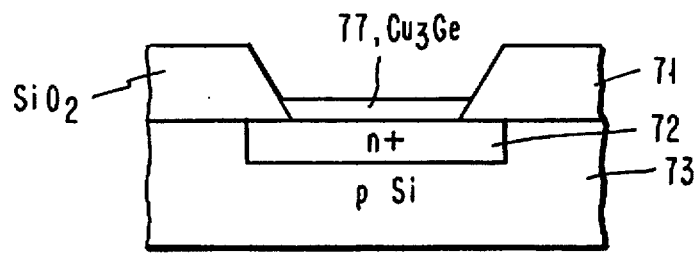
Figure 22:
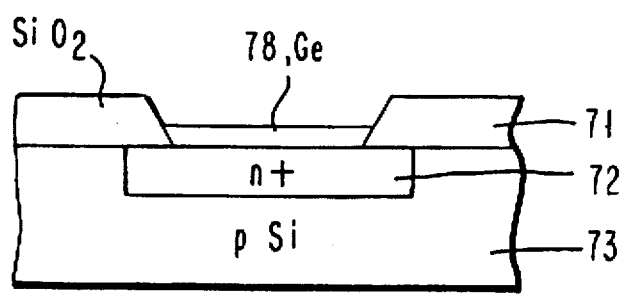
FIGS. 22 through 25 diagrammatically illustrate the sequence of a self-aligned $Cu_3Ge$ process, in accordance with the invention, to produce low resistance self-aligned $Cu_3Ge$ for advanced bipolar, CMOS, and BiCMOS devices.

In order to provide extremely high selectivity between Cu and Cu$_3$Ge, a selective etch process may be used in accordance with the invention. Referring to FIGS. 15 through 21, it will be seen that a layer of Ge 70 having a thickness in the range from about 125 to about 1000 Å is selectively deposited on the exposed silicon surface, which as shown in FIG. 15 includes a SiO$_2$ 71 and an n$^+$ diffused region 72 formed in a p-type Si substrate 73. This is followed by the deposition of a thin Si layer 74 (about 50 to 100 Å) over the entire silicon wafer as shown in FIG. 16. The Si over the SiO$_2$ is then removed using standard lithographic techniques, resulting in the structure shown in FIG. 17. A Cu layer 75 having a thickness in the range from about 125 to about 2000 Å is deposited over the entire silicon wafer as shown in FIG. 18. The structure in FIG. 18 is then heated to a temperature of 200° C. for 30 min. to form thin Cu$_3$Si (76) on top of Cu$_3$Ge (77) as shown in FIG. 19. The excess Cu of layer 75 is then selectively removed by etching in a 10:1 solution of HNO$_3$:H$_2$O which will not chemically attack Cu$_3$Si. This results in the structure shown in FIG. 20. The Cu$_3$Si layer 76 is then chemically removed by a 5 sec. dip in 50:1 diluted HF, resulting in the structure shown in FIG. 21.

Alternatively, the thin Si layer 74 in FIG. 16 can be selectively deposited over the Ge layer 70 to avoid the lithography step. This technique allows the use of Cu$_3$Ge in a self-aligned process for VLSI technology.

Figure 23:
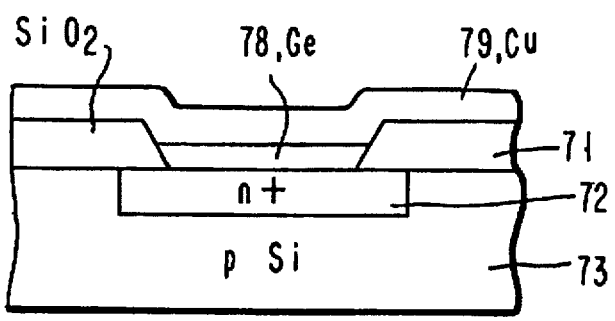
Figure 24:
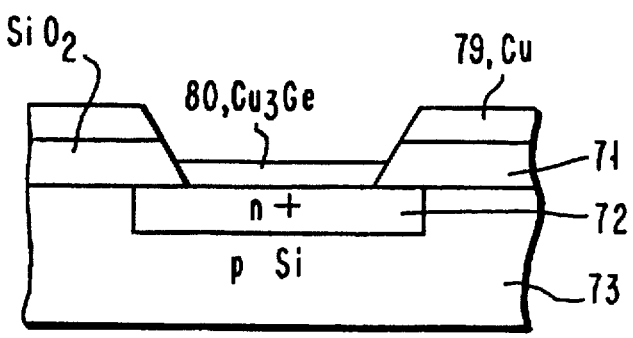
Figure 25:
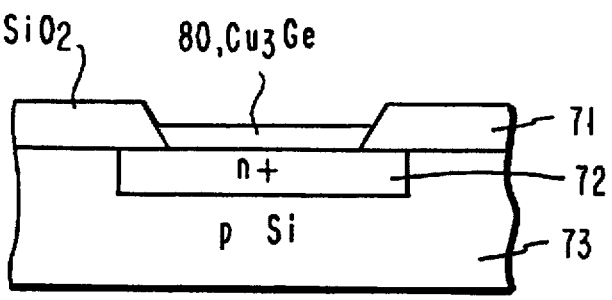

The present invention also contemplates a self-aligned Cu$_3$Ge process to produce low resistance self-aligned Cu$_3$Ge for advanced bipolar, CMOS, and BiCMOS devices. More particularly, with reference to FIGS. 22–25, self-aligned copper germanide can be formed in the following sequence:

1. a selective deposition of a thin Ge film 78 (e.g., 70 nm) over exposed silicon (FIG. 22) of the form shown in FIG. 15. Such deposition is possible with UHV/CVD or other selective epitaxy processes at fairly low temperatures (≦700° C.).
2. sputter or evaporate a layer 79 of Cu (e.g. 140 nm) as shown in FIG. 23.
3. the structure shown in FIG. 23 is then heated to temperatures in the range of about 150°–200° C. to form Cu$_3$Ge (80) as shown in FIG. 24.
4. a selective wet chemical etch, using for example 10:1 solution of HNO$_3$:H$_2$O with selectivity of 15:1, is then used to remove the unreacted Cu of layer 79 while leaving Cu$_3$Ge intact, as shown in FIG. 25.

Step 1 is not necessary if the substrate is Ge. Alternatively, with a Si substrate one can implement a Si/Ge deposition or ion implantation of Ge followed by thermal oxidation and oxide etch to pile up Ge at the surface.

Figure 7:
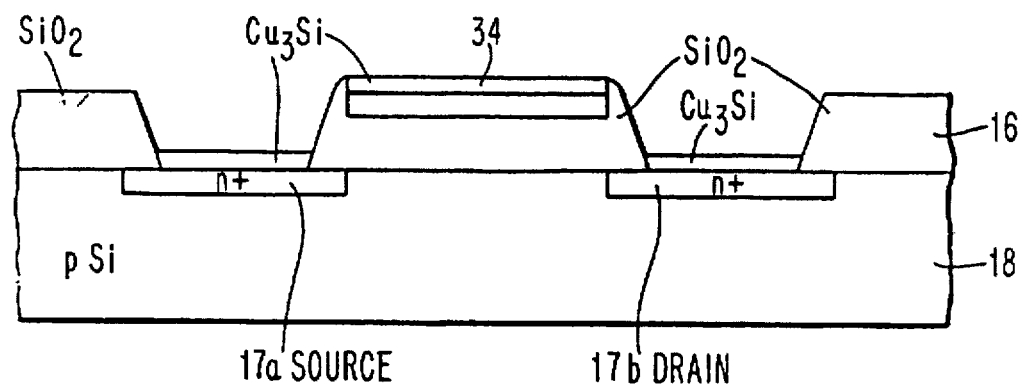
FIG. 7 is a view as in FIG. 6 of the device after heating to form a copper silicide ($Cu_3Si$) layer in keeping with the invention and the excess Cu Si has been chemically removed.
Figure 26:
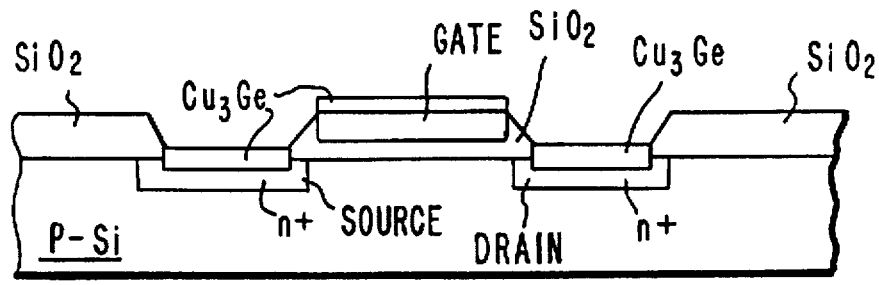
FIGS. 26 through 28 illustrate respectively a possible CMOS device with self-aligned copper germanide over gate, source, drain, and two examples of bipolar devices with self-aligned $Cu_3Ge$ over emitter, base and collector.
Figure 27:
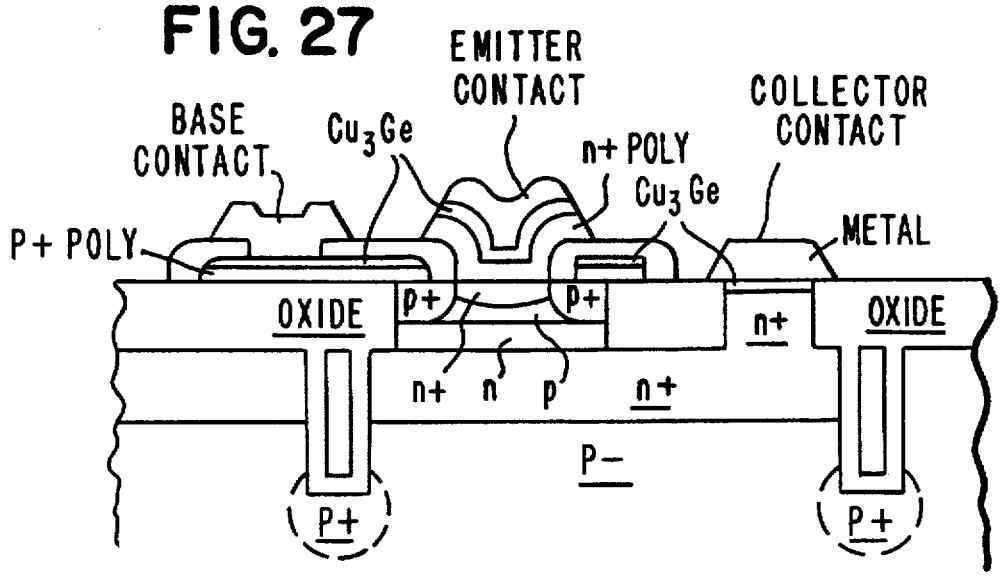
Figure 28:
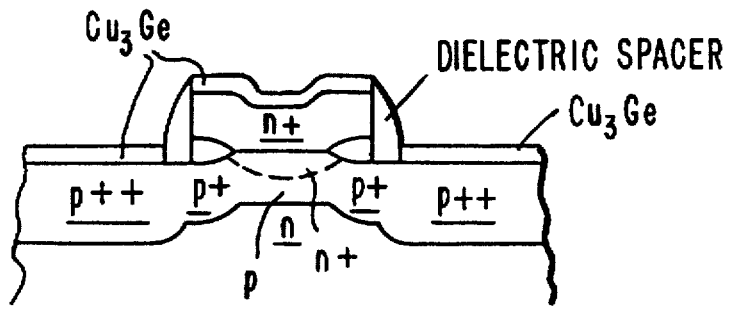

Possible CMOS devices with self-aligned copper germanide over gate, source, and drain may thus be constructed in the form illustrated in FIG. 26, which is similar to that indicated in FIG. 7 for $Cu_3Si$. Similarly, examples of bipolar devices with self-aligned $Cu_3Ge$ over emitter, base and collector are shown in FIGS. 27 and 28.

Figure 29:
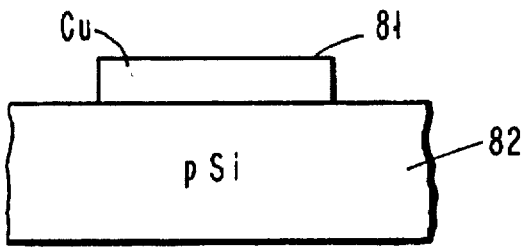
FIGS. 29 through 32 diagrammatically illustrate an improved technique for fabricating a MOS structure at very low temperatures for applications in CMOS devices in accordance with the invention.
Figure 30:
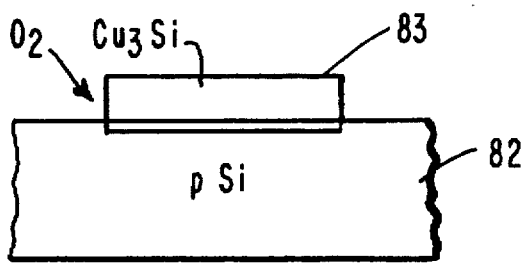
Figure 31:
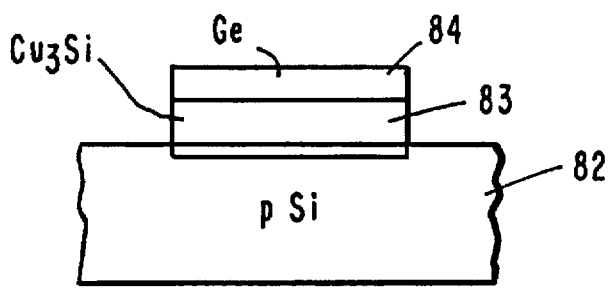
Figure 32:
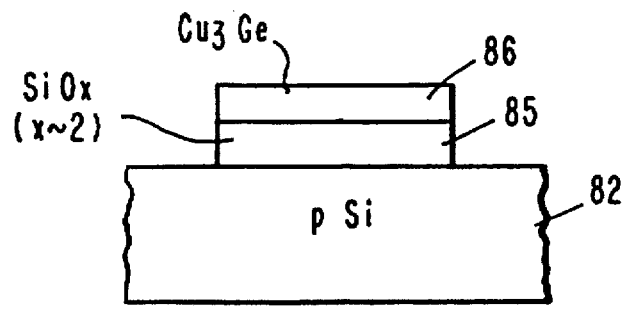

An improved technique for fabricating a MOS structure at very low temperatures for applications in CMOS devices in accordance with the invention is illustrated in FIGS. 29 through 32. A layer of Cu 81 is first deposited to a thickness of from 50 Å to 500 Å on a Si substrate 82 at room temperature, as shown in FIG. 29. The structure in FIG. 29 is then heated to a temperature of 200° C. for a period of from 10 to 30 min. in a pressure of about $10^{-7}$ Torr to form the $Cu_3Si$ layer 83, as shown in FIG. 30. The structure in FIG. 30 is then cooled to room temperature. This is followed by exposing $Cu_3Si$ layer 83 to oxygen at a pressure of from $10^{-6}$ to $10^{-7}$ Torr for a period ranging from 30 to 45 min. A layer 84 of Ge is then immediately deposited to a thickness of 300 Å to 500 Å on top of the $Cu_3Si$ layer 83, as shown in FIG. 31. Oxygen introduced in the layer 83 bonds to Si, thus forming a layer 85 of $SiO_x$ (with x~2) and freeing Cu, which remarkably is found to react with Ge forming a layer 86 of $Cu_3Ge$, resulting in the structure shown in FIG. 32. The advantage of this simple technique over all prior art is that a MOS structure is formed at very low temperatures.

The present invention may also be applied to FET technology by using $Cu_3Ge$ as a midgap gate metal. In particular, improvement in transconductance is obtained by eliminating or significantly reducing channel implant for the adjustment of the threshold voltage of FETs to a midgap.

Performance improvement in FET technology, as well as an increase in device density, requires scaling down of device dimensions. Howvever, there are some non-scaling parameters that can be modified only with the choice of suitable materials. One such parameter is the resistivity of the interconnect and gate metallurgy. The other is the work function of the gate metal on silicon. Clearly, there is a limit on the extendability of polysilicon gate FETs to the linewidths at and below 0.5 µm. A presently considered polycide approach for the FET gate, reduces resistivity by two orders of magnitude. This approach consists of forming low resistivity silicide, such as $WSi_2$ or $TiSi_2$ with an underlayer of poly-Si over the thin gate $SiO_2$. This polysilicon layer is required for oxidation and to preserve gate integrity.

However, the problem of a proper work function remains, since it is still the work function of $n^+$ poly-Si ($\phi_m$=4.05 eV) that sets the mobility of the carriers in the channel for a given threshold voltage $V_T$. To maximize the mobility, it is necessary to reduce or eliminate channel implant for threshold adjustment. This, for 0.5 µm NMOS technology, leads to a gate metal with the work function of $\phi_{mn}$=~4.6 eV, which is between $n^+$ and $p^+$-polysilicon. In CMOS technology, such a choice is desirable as well, since it would require minimal and symmetric channel implants even at linewidths below 0.5 µm.

In accordance with the present invention $Cu_3Ge$, having a work function of 4.6 eV, is applied as a midgap gate metal to be used directly over $SiO_2$. The stability of this material is very high and it is very resistant to oxidation. Furthermore, it is an excellent conductor with room temperature resistivity as low as 5.5 µΩ-cm and decreasing to less than 1 µΩ-cm at 77 K. The lowering of the temperature will significantly reduce RC losses in the interconnects. Si-based FETs with fine line dimensions below 0.5 µm are designed to be operated at liquid nitrogen temperatures and a CMOS process for 77 K operation has already been tested. The stability of $Cu_3Ge$ on $SiO_2$ has been demonstrated. It offers excellent behavior in an oxygen environment and compatibility with copper metallization.

Figure 33:
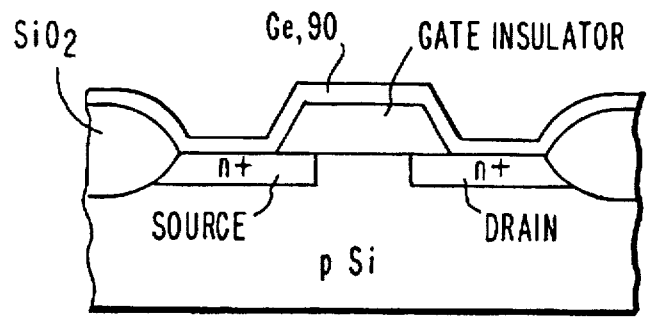
FIGS. 33 through 37 diagrammatically illustrate an improved technique for fabricating $Cu_3Ge$, having a work function of 4.6 eV, as a midgap gate metal to be used directly over $SiO_2$ at very low temperatures for applications in CMOS devices in accordance with the invention.
Figure 34:
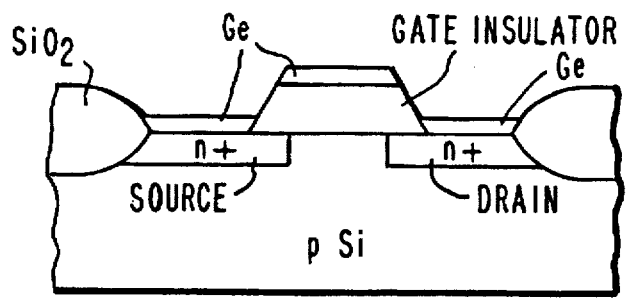
Figure 35:
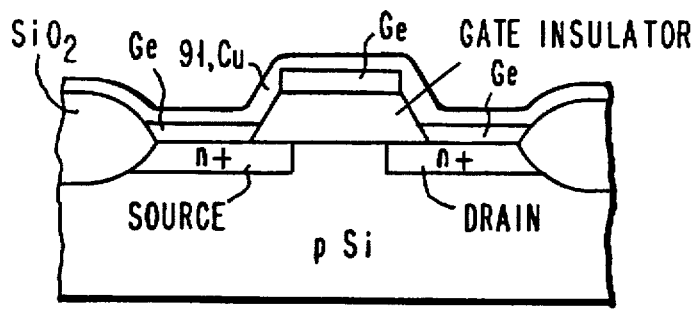
Figure 36:
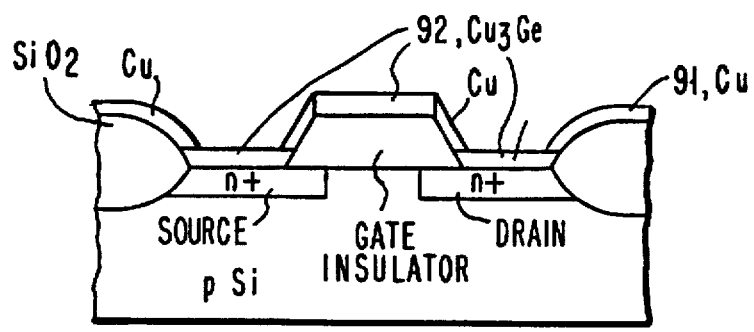
Figure 37:
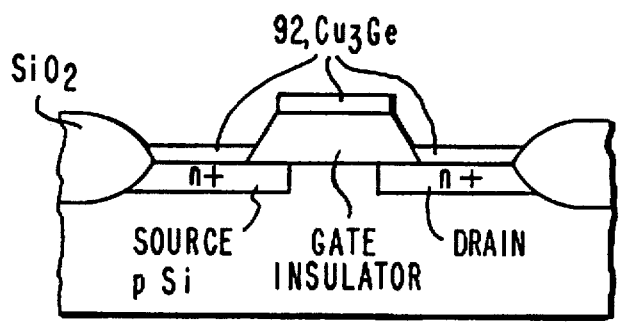

An improved technique for fabricating structures at very low temperatures for applications in CMOS devices in accordance with the invention is illustrated in FIGS. 33 through 37. As seen in FIG. 33, a layer 90 of Ge may be deposited on a Si substrate of the form shown in FIGS. 6, 7, and 26. More particularly, after forming the gate insulator pattern, a thin Ge film 90 (e.g., 70 nm) may be selectively deposited in areas above the source and drain on the substrate and the gate oxide or insulator as shown in FIG. 34. Such deposition is possible with UHV/CVD or other selective epitaxy processes at fairly low temperatures (≦700° C.). A layer 91 of Cu is then deposited by a suitable technique, such as evaporating or sputtering, to a thickness of 140 nm, for example, on the structure of FIG. 34 creating the structure of FIG. 35. The structure shown in FIG. 35 is then heated to temperatures in the range of 150°–200° C. causing the Ge in the areas above the gate insulator, source, and drain to react with the Cu layer 91 to form $Cu_3Ge$ (92) as shown in FIG. 36. A selective wet chemical etch, using for example 10:1 solution of $HNO_3$:$H_2O$ with selectivity of 15:1, is then used to remove the unreacted Cu of layer 91 while leaving $Cu_3Ge$, intact, as shown in FIG. 37.

Figure 38:
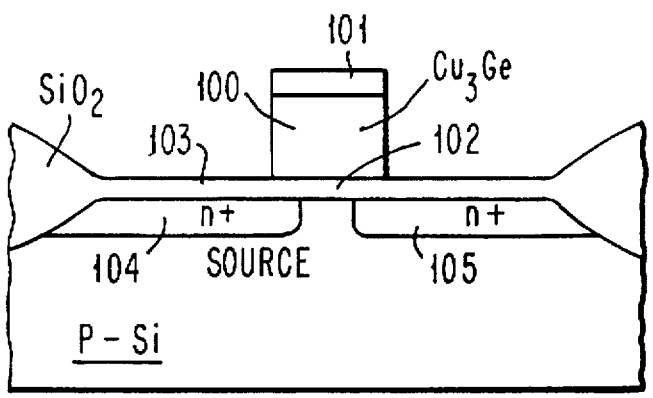
FIGS. 38 through 40 diagrammatically illustrate an alternative technique to that shown in FIGS. 33 through 37.
Figure 39:
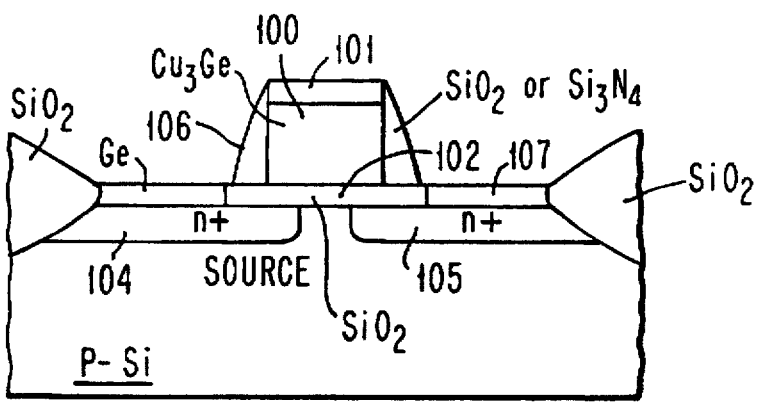
Figure 40:
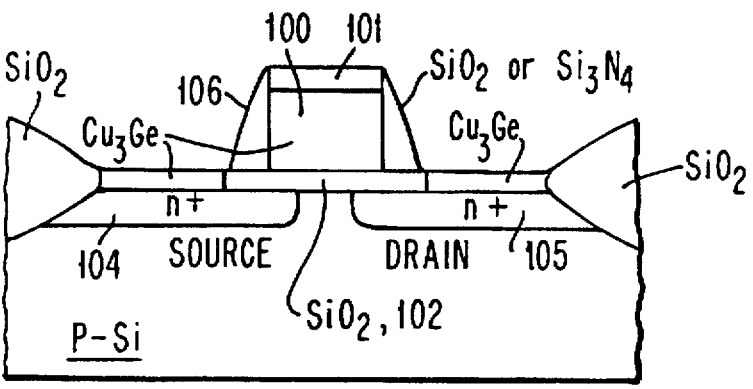

An alternative technique is illustrated in FIGS. 38 through 41. An approximately 200 nm layer 100 of $Cu_3Ge$ with an optional insulator cap 101 can be patterned over the gate insulator 102 of thin $SiO_2$ layer 103 as seen in FIG. 38. The $n^+$ source and drain regions 104, 105, can be formed by ion implantation and drive in a conventional self-aligned fashion. An insulator spacer 106 of $SiO_2$ or $Si_3N_4$ is then formed on the sidewall of the $Cu_3Ge$ gate electrode stack (100, 101) as in FIG. 39. The thin $SiO_2$ layer 103 is then etched away over $n^+$ source and drain regions 104, 105, and Ge (107) is selectively deposited over the exposed source and drain layers. The subsequent processing steps for self-aligned $Cu_3Ge$ formation over the $n^+$ source and drain regions are similar to those described with respect to FIGS. 35 through 37. The ultimate structure is of the form shown in FIG. 40.

It will accordingly be seen that systems and processes have been disclosed that provide simple and electrically stable interconnection metallization utilizing copper, which can be achieved with comparatively low-temperature annealing.

It is also contemplated that the Cu-semiconductor phenomenon of the invention is not limited to use in VLSI interconnection metallization but also offers other advantageous metallurgical applications which will be apparent to those of skill in the art in light of the present teaching. For instance, Ge may be used to retard corrosion in Cu piping through the formation of a surface layer of $Cu_3Ge$ by, e.g., CVD deposition of Ge on the pipe.

What is claimed is:

1. A structure comprising:
   a semiconductor body
   a body of copper having a surface thereon; and
   a layer of a low resistivity $Cu_x$ semiconductor$_{1-x}$ compound interposed between the semiconductor body and the body of copper on at least a part of said surface to substantially prevent diffusion of copper into the semiconductor body, wherein said layer is produced by the steps comprising:
   creating an interface at said surface with a surface of the semiconductor body; and
   treating said interface by maintaining it at a temperature ≦ about 200° C. to form the low resistivity $Cu_x$ semiconductor$_{1-x}$ layer thereat.

2. A structure produced by the steps of claim 1 wherein said treating step comprises maintaining the Cu-semiconductor interface at about room temperature to form said Cu-semiconductor compound.

3. A structure produced by the steps of claim 1 wherein said treating step comprises heating the Cu-semiconductor interface to form said Cu-semiconductor compound.

4. A structure produced by the steps of claim 1 wherein said treating step comprises heating the Cu-semiconductor interface to a temperature of at least about 150° C. for at least about 20 minutes.

5. A structure produced by the steps of claim 1 wherein said semiconductor comprises silicon and said compound comprises $Cu_xSi_{1-x}$.

6. A structure produced by the steps of claim 1 wherein said semiconductor comprises germanium and said compound comprises $Cu_x Ge_{1-x}$.

7. A structure comprising:

a substrate; and an electrical conductor on at least a portion of said substrate wherein said conductor comprises a plurality of layers at least one of which is of a $Cu_x$ semiconductor$_{1-x}$ compound and another of which is of copper, wherein said layer of $Cu_x$ semiconductor$_{1-x}$ compound is on at least a part of said copper layer.

8. A structure as in claim 7 wherein at least one other of said plurality of layers is of an oxygen-containing material disposed on the surface of said substrate, and said $Cu_x$ semiconductor$_{1-x}$ compound is disposed on said layer of an oxygen-containing material.

9. A structure as in claim 7 further comprising a layer of a dielectric disposed on the surface of said substrate, and said $Cu_x$ semiconductor$_{1-x}$ compound disposed on said layer of dielectric.

10. A structure comprising:

a semiconductor having a surface;

a body of Cu disposed at said surface; and a Cu-semiconductor compound interface interposed between said surface and said body of Cu, said compound substantially preventing diffusion of Cu into said semiconductor.

11. A semiconductor device comprising:

a semiconductor substrate;

a multilayer electrical conductor on at least a portion of a surface of said semiconductor substrate, at least one of the layers of the multilayer conductor being copper and another of said layers being a low temperature annealed $Cu_x$ semiconductor$_{1-x}$ compound that forms an interface between said at least one copper layer and said portion of a surface of said semiconductor substrate to substantially prevent diffusion of copper into said semiconductor substrate.

12. The semiconductor device of claim 11 wherein said interface is created by heating the copper layer and the semiconductor substrate to a temperature about $\leq 200°$ C. to create the $Cu_x$ semiconductor$_{1-x}$ compound of the interface layer.

13. The structure of claim 12 wherein said Cu-semiconductor compound is a Cu—Ge compound.

14. The structure of claim 12 wherein said Cu-semiconductor compound is a Cu—Si compound.

* * * * *